United States Patent [19]

Marino et al.

[11] 4,356,531
[45] Oct. 26, 1982

[54] COMPUTER MOUNTING ASSEMBLY

[75] Inventors: Jerry C. Marino, Sudbury; Lawrence J. Bibeau, Worcester, both of Mass.

[73] Assignee: Data General, Inc., Westboro, Mass.

[21] Appl. No.: 231,869

[22] Filed: Feb. 5, 1981

Related U.S. Application Data

[63] Continuation of Ser. No. 21,257, Mar. 16, 1979, abandoned.

[51] Int. Cl.$^3$ .............................................. H05K 7/20
[52] U.S. Cl. .............................. 361/384; 312/257 SK; 361/415
[58] Field of Search .................. 312/257 SK, 257 SM, 312/263, 211, 240; 165/80; 174/16 R; 361/331, 383, 384, 415, 391-395, 413, 426, 429, 356, 380; 211/41, 50; 220/4 F; 206/328

[56] References Cited

U.S. PATENT DOCUMENTS

| | | | |
|---|---|---|---|
| 3,495,132 | 2/1970 | Anhalt | 361/381 |
| 3,767,974 | 10/1973 | Donovan, Jr. | 361/391 |
| 3,853,379 | 12/1974 | Goodman | 361/391 |
| 3,915,307 | 10/1975 | Agarde | 361/415 |
| 4,002,381 | 1/1977 | Wagner | 361/415 |
| 4,027,206 | 5/1977 | Lee | 361/384 |
| 4,040,694 | 8/1977 | Lascarrom | 312/257 SK |
| 4,102,554 | 7/1978 | Reimer | 312/257 SK |
| 4,116,510 | 9/1978 | Franco | 312/140 |
| 4,122,508 | 10/1978 | Rumbaugh | 361/384 |
| 4,151,580 | 4/1979 | Struger | 361/415 |

Primary Examiner—Gerald P. Tolin
Attorney, Agent, or Firm—Robert T. Gammons

[57] ABSTRACT

A computer housing comprising spaced, parallel side walls containing grooves for slidingly receiving cards and spaced, parallel top and bottom walls to which the side walls are secured to provide, in conjunction with the side walls, a card cage and an enclosure for removably receiving, respectively, cards and a fan module, the invention comprising means for assembling the side walls to the top and bottom walls preparatory to securing them, comprising jig means on the side walls and top and bottom walls adapted to be interengaged to support the component walls in precise assembled relation to each other for securing and means independent of the jig means for securing the assembled walls to each other while so held by said jig means and including devices to assist in inserting and removing the cards and for coupling and uncoupling the fan module to a source of power.

7 Claims, 18 Drawing Figures

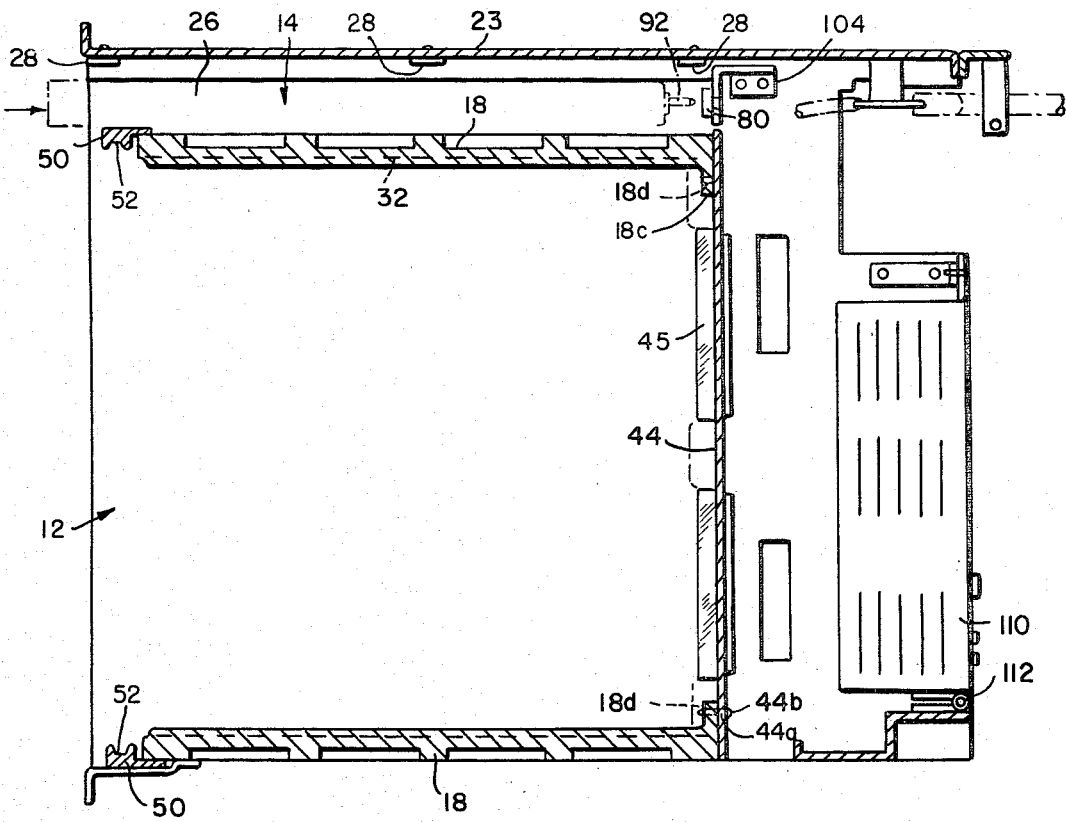
FIG.4
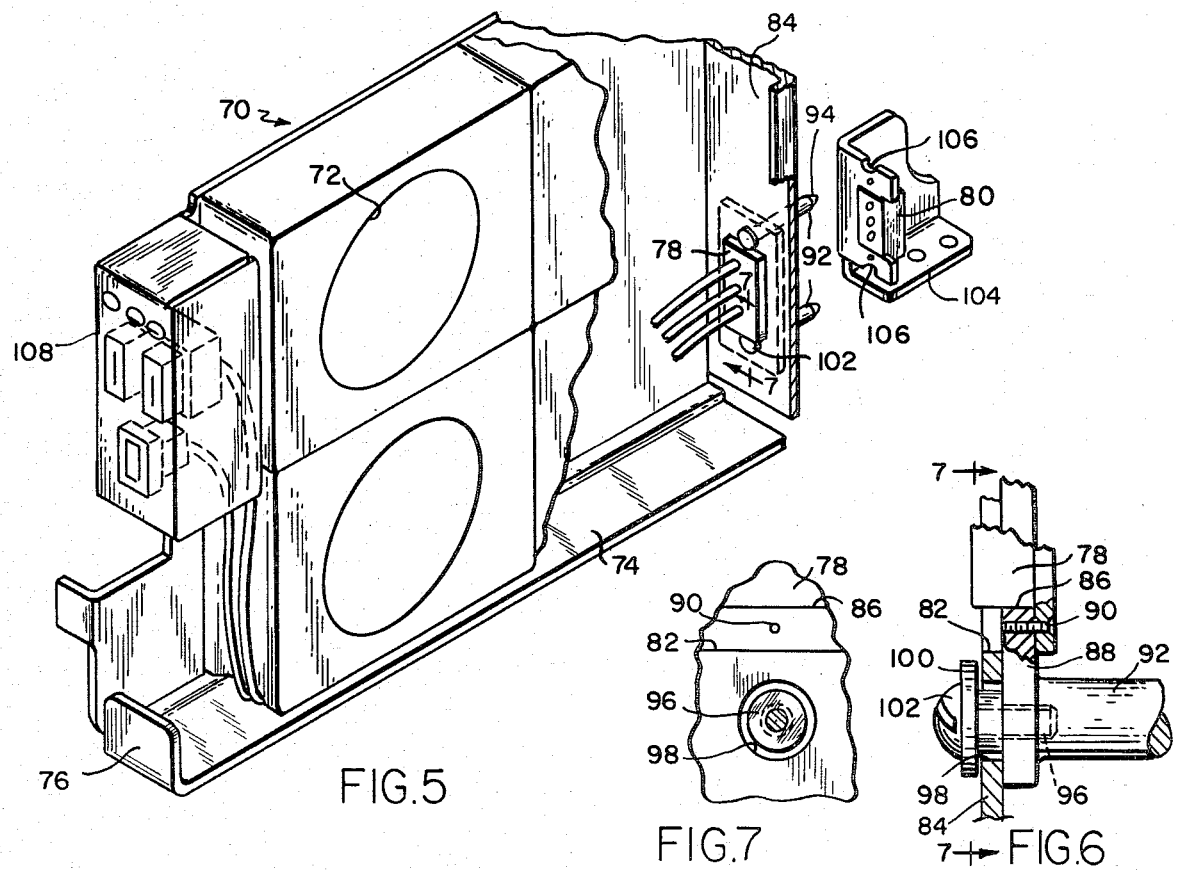
FIG.5
FIG.7
FIG.6

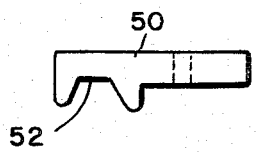
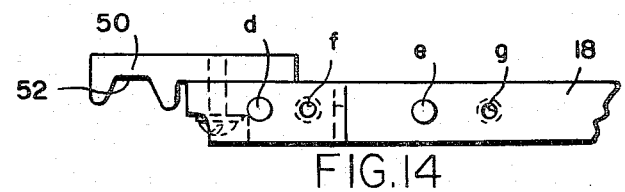
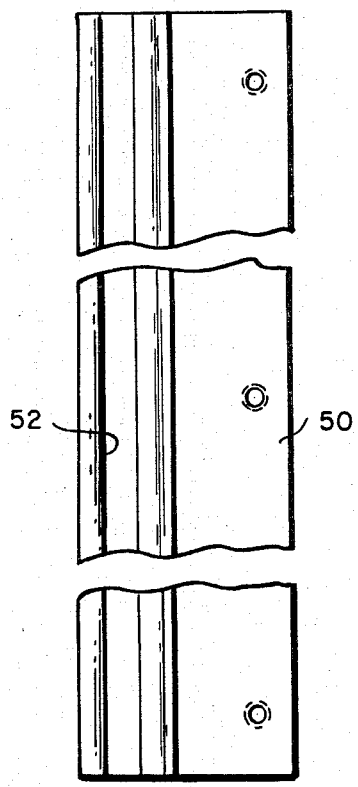
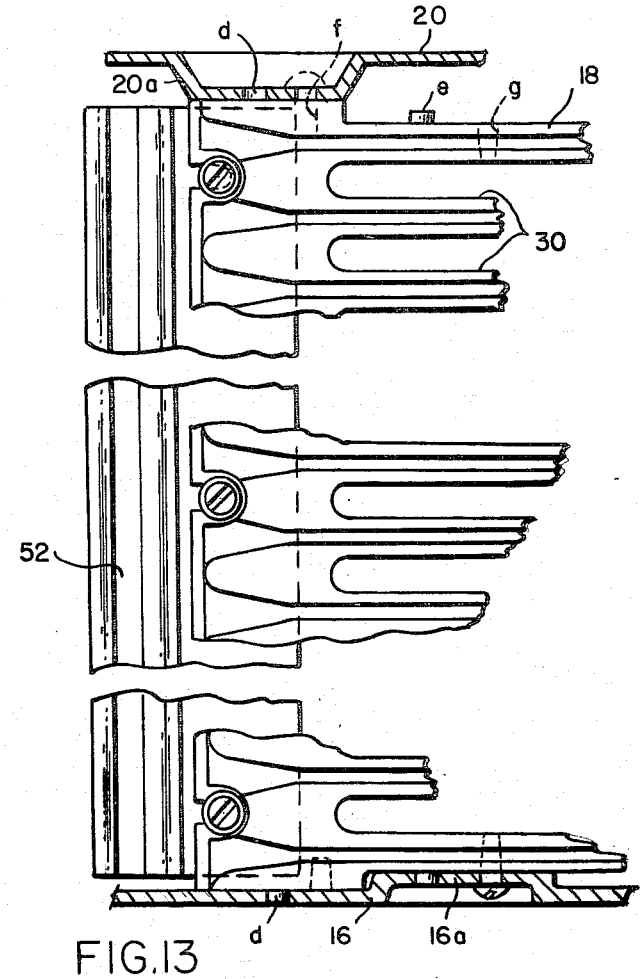
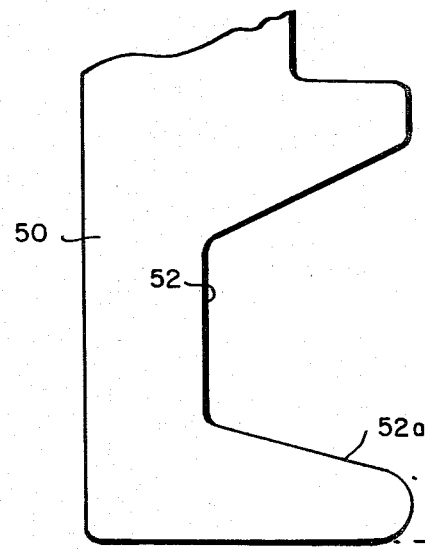
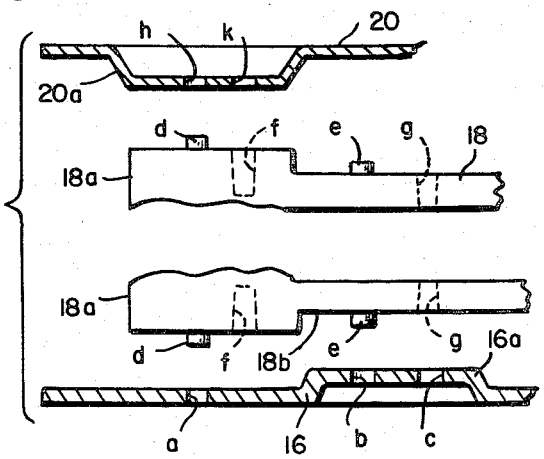

COMPUTER MOUNTING ASSEMBLY

This is a continuation, of application Ser. No. 21,257 filed Mar. 16, 1979, now abandoned.

BACKGROUND OF THE INVENTION

Heretofore, computer housings have been constructed of sheet metal prepunched with holes for receiving fastenings, usually screws. Each part was, of necessity, assembled to an adjacent part by holding it in position and inserting screws through the prepunched holes, a task difficult to accomplish except with the aid of jigs and/or helpers because of the fact that the parts are relatively large and to hold the parts steady while trying to insert screws in almost impossible, especially if the holes are slightly out-of-line or the sheet material of the parts is warped or bent. Further, in such prefabricated housing, it was customary to attach the fan housings to the outside of one of the side walls which required additional brackets and fastening means for fastening them in place with the disadvantage that, in the event that the fans had to be repaired or replaced, the entire unit, including their brackets, had to be removed. Additionally, because of the impreciseness of the assembled parts, the terminals at the ends of the cards and on the end wall were not always accurately aligned and it was difficult to engage and disengage these terminals without damage. The purpose of this invention is to remedy the aforesaid difficulties.

SUMMARY OF THE INVENTION

In a computer housing comprising spaced, parallel side walls containing grooves for slidingly receiving cards carrying at one end terminals and top and bottom walls to which the side walls are secured to provide a card cage for receiving cards and an enclosure for receiving a fan module, means for assembling the side walls to the top and bottom walls preparatory to securing them, comprising positioning means associated with the side walls and top and bottom walls adapted to be interengaged to support the walls in a precise relation to each other for securing and means for securing the precisely-positioned walls while held by said positioning means. The side walls and bottom wall are die-cast and the positioning means are pins and holes for receiving the pins. The top wall is sheet metal and the positions means are formed by pressing operations. The fastening means comprise smooth bore holes and self-threading screws. The side walls are reversible. There is a bank of terminals at one end of each card and a transversely-disposed end wall secured between the side walls and the top and bottom walls perpendicular to the bottom wall to which there are mounted banks of terminals mateable with those at the ends of the cards. There is means for effecting movement of the cards within the cage to engage and disengage the terminals, comprising at the end of each card opposite that carrying the terminals and at each corner a lever operable on the one hand to move the card in a direction to engage the interengageable terminals and on the other hand to disengage the interengageable terminals. Specifically, the means for effecting movement of the cards comprise at opposite sides of the two side walls means defining vertical confronting channels and levers pivotally attached to the opposite corners of the cards, each lever being provided with a heel and toe arranged, respectively, to remove and insert the cards. One of the side walls is spaced inwardly of one side of the bottom wall and the bottom wall outwardly thereof contains a groove for slidingly receiving a fan module in parallel relation to the side wall. The top wall has at a corresponding side a cover panel which, in conjunction with the side wall and the bottom wall define an enclosure for the fan module. There is a stationary terminal mounted within the housing and a movable terminal mounted to the fan module for radial movement in a plane perpendicular to the direction of movement of the fan module into a position of engagement with the fixed terminals and pilot means carried by the radially movable mounting and the stationary terminal for aligning the terminals for engagement. There is a power pack tray and means at two opposite sides thereof for slidably engaging the grooves in the side walls for supporting the power pack tray in spaced, parallel relation to the cards in the cage and means at the top of the tray for shielding the power pack from the cards.

The invention will now be described in greater detail with reference to the accompanying drawings, wherein:

FIG. 4 is a horizontal section taken on the line 4—4 of FIG. 1;

FIG. 5 is a perspective of the fan module broken away in part showing two fans, the terminal for connecting the fans to a source of power and piloting means for guiding the fan terminal into a stationary supply terminal within the housing;

FIG. 6 is a section taken on the line 6—6 of FIG. 5;

FIG. 7 is a fragmentary elevation taken on the line 7—7 of FIG. 6;

FIG. 13 is a fragmentary view from the inside of one side wall at the forward end showing one of the channel components of the means for effecting movement of the cards into and out of the cage;

FIG. 14 is a top view of FIG. 13;

FIG. 15 is an elevation of the channel component;

FIG. 16 is a top view of FIG. 15;

FIG. 17 is an enlarged plane view of the channel component; and

FIG. 18 is a fragmentary section showing the relation of the positioning means in the top, side and bottom walls.

Figure 1:
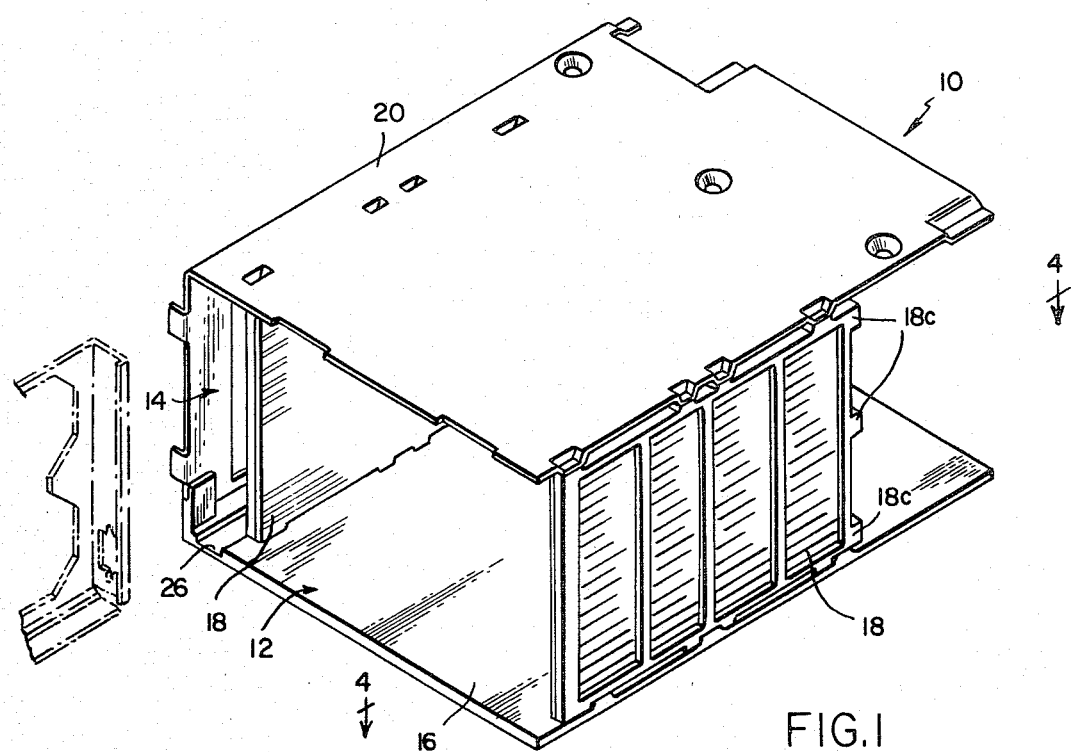
FIG. 1 is a perspective view of the computer housing.

Referring to the drawings, FIG. 1, the computer housing 10 provides a card cage 12 and enclosure 14 for removably receiving a fan module so designed that the component parts comprising the bottom wall 16, side walls 18—18 and top wall 20 can be precisely assembled and secured to each other without accessory jigging or the aid of an assistant, with a minimum of expenditure of time and, hence, cost, prior to and independently of the means for ultimately securing the walls to each other.

Figure 3:
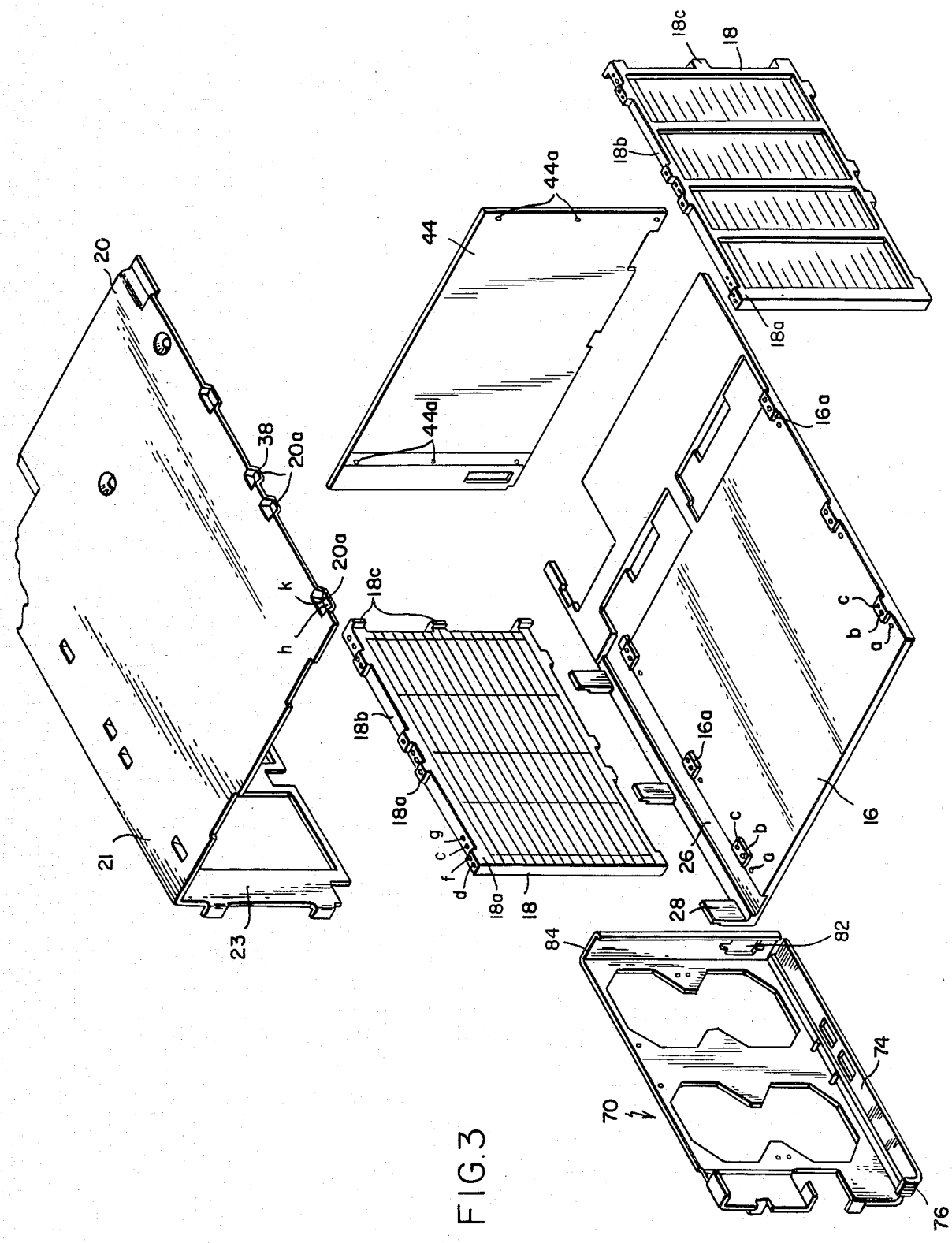
FIG. 3 is an exploded perspective of the computer housing showing in addition the fan module without fans.
Figure 10:
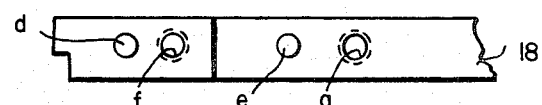
FIG. 10 is a fragmentary plan view as seen from the top of FIG. 8.

The bottom wall 16, FIG. 3, is die-cast and is provided at two opposite sides with precisely-positioned positioning means comprising smooth bore holes a, b and c perpendicular to the bottom located in spaced groups longitudinally of the bottom. The holes a are formed in the plane of the upper surface of the bottom wall and the holes b and c are formed in bosses 16a projecting upwardly from the upper surface of the bottom wall. The holes at the left side as shown in FIG. 3 are spaced inwardly from the left edge and the portion of the bottom wall outwardly of these holes contains a groove 26. Outwardly of the groove 26, there are longitudinally-spaced posts 28.

Figure 9:
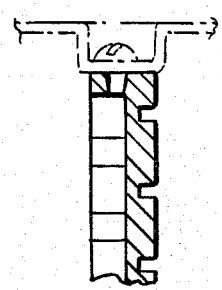
FIG. 9 is a section taken on the line 9—9 of FIG. 8.
Figure 8:
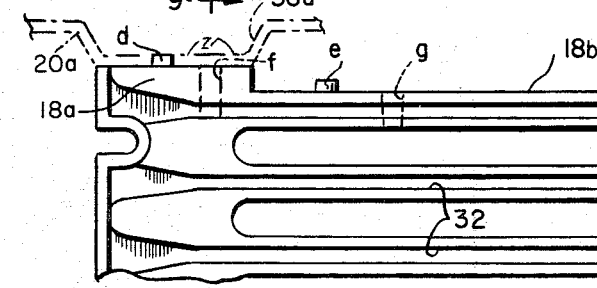
FIG. 8 is a fragmentary elevation of a side wall showing the positioning means for assembling the side walls to the bottom and top walls preparatory to fastening.
Figure 8:
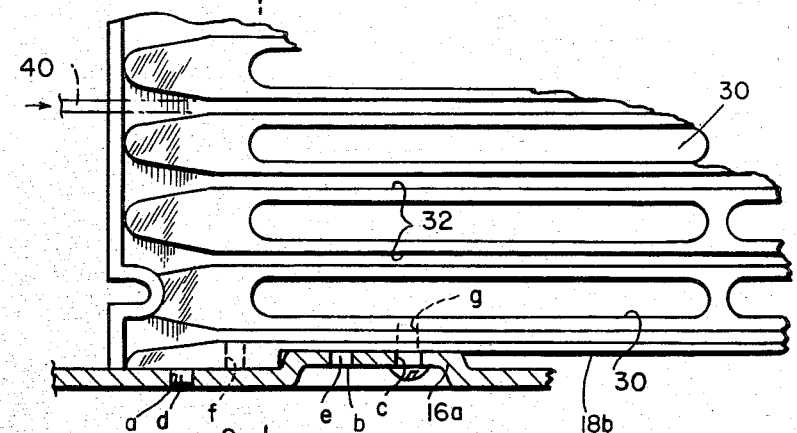

The sides 18 are die-cast and provided with spaced, parallel open slots 30, FIGS. 8 and 13, and between the slots at the inner side spaced, parallel grooves 32, FIG. 9. The upper and lower edges of the side walls are provided with positioning means comprising pins d and e and holes f and g. The pins d and holes f are formed on bosses 18a between which there are recesses 18b. The pins e and holes g are formed in the recesses. The rear ends of the side walls are provided with bosses 18c, FIG. 1, containing smooth bore holes 18d.

The top wall 20, FIG. 3, is sheet metal and has formed along its opposite sides positioning means comprising holes h,k formed inthe downwardly-displaced portions 20a below the plane of the top. When assembled, the downwardly-displaced portions 20a of the top wall rest on the upwardly-projecting bosses 18a at the top of the side walls and the pins d at the top of the side walls engage with the holes h in the top wall, the upwardly-projecting bosses on the bottom wall extend upwardly into the recesses 18b in the side walls and the pins d and e engage within the holes a and b. The walls are secured following positioning by inserting screws through the holes k at the top and c at the bottom and screwing them into the smooth bore holes f and g, respectively.

The positioning means comprising the pins and matching holes in the side walls and bottom and top walls, respectively, enable assembling the side walls to the bottom and top walls without the aid of fasteners and of thereafter inserting fasteners for securing the component parts in rigidly fixed relation to each other. Because of the specific arrangement of the pins and holes, the side walls 18 are identical and can be reversed so that a single mold may be used for molding the side walls with a saving in mold cost and eliminating loss of time during assembly in selecting from a stack of side walls the right side wall for the right side. Further, by providing the downwardly and upwardly-displaced portions in the bottom and top walls, the heads of the securing screws are recessed and so do not protrude. The top wall has outwardly of the positioning means an extension 21 in the plane of the top and an extension 23 at right angles therein which, in conjunction with the bottom wall and outer side of the side wall, define the enclosure 14. The lower edge of the extension 23 is provided with holes for receiving screws for attachment to the posts 28.

An end wall 44 is attached to the rear ends of the side walls and, for this purpose, is provided with drilled holes 44a for receiving bolts 44b for threaded engagement with threaded holes 18d in the bosses 18c.

Figure 11:
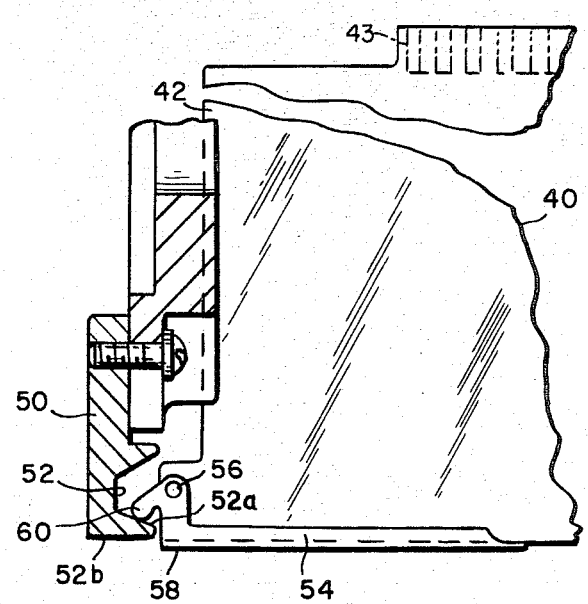
FIG. 11 is a fragmentary horizontal section showing a portion of the card and the lever means for inserting and removing the card.

The cards 40, one of which is shown in FIG. 11, are supported within the card cage 12 with their opposite edges 42—42 slidingly engaged within the grooves 32—32 and have at their inner ends transversely thereof a bank of terminals, 40a. The end wall 44, FIGS. 3 and 4, is secured to the rear ends of the side walls between the bottom and top walls and perpendicular to the bottom wall and has mounted thereto banks 44a terminals corresponding in number to the cards which are mounted within the grooves 32—32 and with which the terminals carried by the cards are adapted to be engaged by sliding the cards into the card cage. The terminals are small and closely-spaced and so it is essential that there be a high degree of precision in the transverse and vertical positioning of the cards with respect to the terminals 45 on the end wall 44 and this is achieved in large part by the positioning means referred to above which enables accurately assembling the parts so that when they are ultimately fastened to each other, the initial positioning will be preserved.

Figure 12:
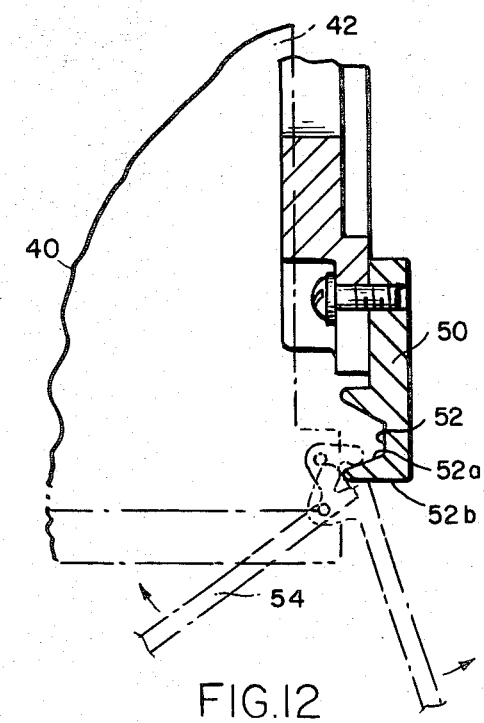
FIG. 12 is a view similar to FIG. 1 showing the lever action.

As has been mentioned, there is a bank of terminals 43 on the rear ends of the cards which have to be engaged and disengaged with a corresponding number of terminals 45 on the end wall 44. The frictional resistance to engagement and disengagement of the terminals is such that it is desirable to have a mechanical assist in the form of lever means for both engaging the terminals and disengaging the terminals. The lever means for this purpose is shown in FIGS. 11 and 12 and comprises as components a channel plate 50 bolted to the forward edge of each side wall containing a vertical channel 52, and a lever arm 54 pivotally mounted at 56 at each forward corner of the card 40 provided with a heel 58 and a toe 60. When the lever is parallel to the front edge of the card, which is the position it would have when a card has been fully inerted into the cage, the toe 60 bears against the inner side 52a of the channel 52, the inclination of which is approximately 14° to the end face 52b. In this position, the terminals at the inner end of the card are engaged with the terminals on the end wall 44. If it is desirable to withdraw the card, the lever 54 is swung in a clockwise direction which will bring the heel 58 into engagement with the end face 52b of the channel 52 as shown in FIG. 12 so as to forcibly withdraw the card. To return the card, the lever is swung in a counterclockwise direction to cause the toe by engagement with the surface 52a to push the card inwardly. There are a pair of levers 54 on the forward corners of each of the cards.

Figure 2:
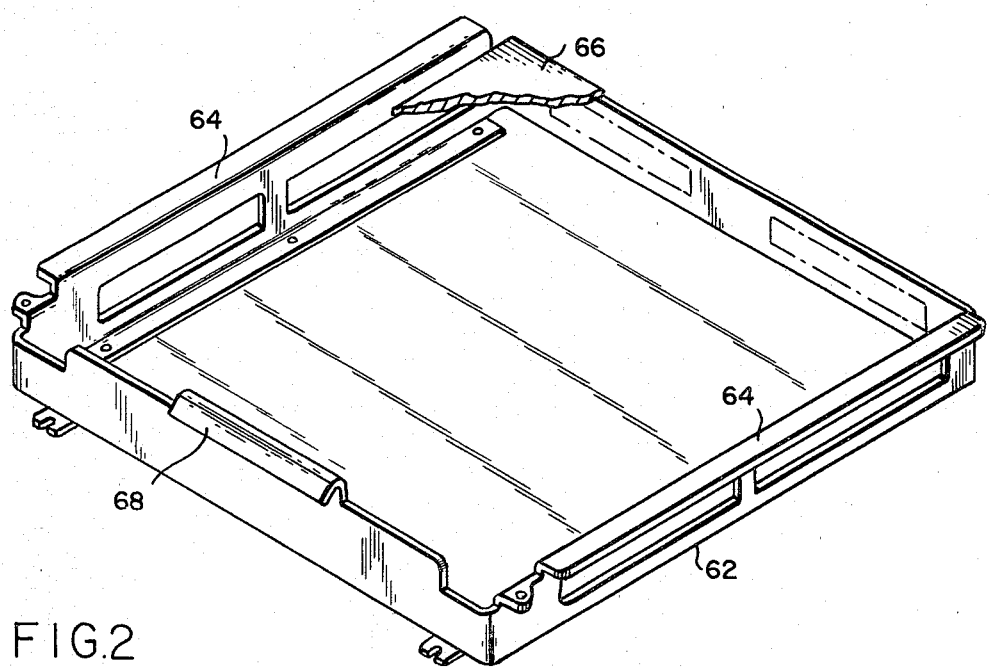
FIG. 2 is a perspective view of a power pack tray.

There is included within the card cage a power pack tray 62, FIG. 2, which is provided at two opposite sides with horizontal flanges 64—64 for sliding engagement with the grooves 32—32 and this power pack tray is mounted at the bottom of the cage below the lowermost card 40 and is provided with a shield 66 at the top for separating it from the cards. A lip 68 at the forward end of the tray provides for removing it from the cage when desirable.

A fan module 70, FIGS. 3 and 5, is used in conjunction with the housing and, as herein illustrated, provision is made in the form of an enclosure 14, outside the card cage 12, for slidingly receiving the module 70 and the fan units 72 assembled therein of which there are four. The fan module 70 is dimensioned to be slidably received within the enclosure 14 and, to this end, is provided at its bottom with a runner 74 for sliding engagement with the groove 26 in the bottom wall, the forward end of which is provided with a perpendicular lip 76 to enable easily grasping the module for sliding it into and out of position. At the rear end of the module, there is a terminal block 78 and within the housing rearwardly of the end wall 44, there is a stationary block 80 connected to a source of power. The terminal blocks 78 and 80 have interengageable terminal elements and in order to guide these elements into interengagement as the fan module is slid into position, the terminal block 78 is mounted for radial movement in a plane perpendicular to the direction of movement of the module into position as shown in FIGS. 5, 6 and 7. The terminal block 78 is mounted in an oversized hole 82 in the end wall 84 of the module and is secured therein within an opening 86 in a pilot plate 88 at the other side of the end wall 84 by means of screws 90. The pilot plate has extending forwardly from it a pair of spaced, parallel pilot pins 92—92 having conical end portions 94—94. The pilot plate 88 is mounted to the end wall 84 by means of screws 96—96 inserted through enlarged holes 98—98 in the end wall 84 and screwed into the pilot plate with washers 100—100 between the heads 102—102 and the end plate. Thus, the pilot plate 88 is free to move radially. The terminal block 80 is rigidly mounted to a bracket member 104 secured to the bottom wall of the housing so that it is stationary and the bracket contains above and below the terminal block recesses 106—106 for receiving the pilot pins 92—92 to thereby shift the pilot plate to a position of registration of the terminals carried by the terminal block 78 and the terminal block 80 into exact alignment with each other.

As illustrated in FIG. 5, the fan module is provided with a switch block 108 for turning the fan motors off and on.

Rearwardly of the end wall 44, FIG. 4, there is a power module 110 pivotally mounted at 112 for swinging about a vertical axis perpendicular to the bottom from an operative position parallel to the end wall 44 outwardly from the housing to provide for ease of access to the component parts therein and to the end wall.

The housing as thus described enables total assembly without the need for costly forms and/or fixtures and without requiring adjustment or special tools to create a final assembly. The positioning means eliminates the need for hardware to provide for ease of card entry into the final assembly and the isolation of the positioning means from the connectors provides for greater latitude of misalignment and lead-in. The diameter and length of the pilot pins for the fan module may be varied to meet the necessary radial displacement and lead-in requirements. Various materials may be used in making the component such as die-cast aluminum, injection molded plastic and the like.

It should be understood that the present disclosure is for the purpose of illustration only and includes all modifications or improvements which fall within the scope of the appended claims.

What is claimed is:

1. A computer housing receiving a plurality of computer components in precisely predetermined relation to each other, comprising orthogonally positioned intersecting top, bottom and side walls, mutually-interengaged first positioning means preformed at the intersections of the walls which, by interengagement, hold the walls in precisely predetermined relation to each other, fastening means at said intersections which secure the walls in said predetermined relation to each other as determined by said positioning means, second positioning means carried by the walls receiving said components, said second positioning means being positioned so that, when the walls are secured in said predetermined positions relative to each other as determined by the first positioning means, said components received by said second positioning means will bear a predetermined operative relation to each other, and wherein one of the computer components comprises a fan module and wherein one of the side walls is spaced inwardly from the edge of the bottom wall and that portion of the bottom wall outwardly of the side wall contains a groove slidingly receiving the fan module in parallel relation to the side walls.

2. A computer housing according to claim 1 wherein another of the computer components comprises cards and the second positioning means comprise spaced, parallel grooves in the side walls within which the cards are slidingly received in precisely-spaced parallel relation.

3. A computer housing according to claim 2 wherein still another computer component comprises a power pack tray and means at the two opposite sides of the power pack tray slidingly engaging the power pack tray within the lowermost grooves in the side walls and supporting the power pack tray in spaced, parallel relation to the cards and means at the top of the power pack tray electrically shielding the power pack tray from the cards.

4. A computer housing according to claim 2 wherein there is a back wall fastened to the rear edges of the side walls at right angles to the side walls, terminals fastened to the back wall in vertically-spaced, parallel rows transversely of the top and bottom walls at a spacing corresponding to the grooves in the side walls and wherein there are terminals at the rear ends of the cards slidingly engaged in grooves for interengagement with the terminals on the back.

5. A computer housing according to claim 4 comprising means at the forward ends of the cards and means on the forward edges of the side walls cooperable to on the one hand withdraw cards from the structure to disengage the terminals and on the other hand to push the cards into the grooves to engage the terminals.

6. A computer housing according to claim 1 wherein the top wall has an orthogonal extension spaced from and parallel to said one side wall constituting a cover which in conjunction with the side wall and bottom wall define a fan chamber for receiving the fan module.

7. A computer housing according to claim 6 wherein there is a terminal mounted on the fan module and a terminal mounted on the housing, and pilot means for guiding the terminals into engagement when the module is pushed into the fan chamber.

* * * * *